Figure 1:
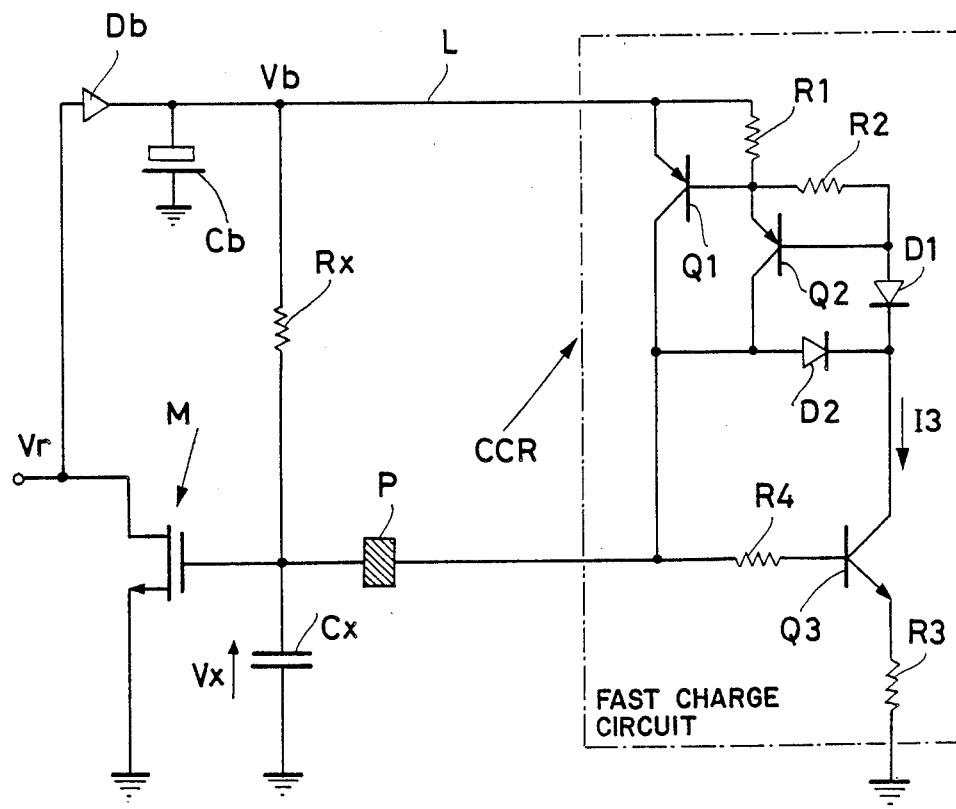

United States Patent [19]
Gola et al.

[11] Patent Number: 4,956,570
[45] Date of Patent: Sep. 11, 1990

[54] PILOT CIRCUIT WITH INTEGRATED CIRCUIT WITH PRESET FIRING DELAY FOR MOS POWER TRANSISTORS

[75] Inventors: Alberto Gola, Broni; Gianluigi Pessina, Lainate, both of Italy

[73] Assignee: SGS-Thomson Microelectronics s.r.l., Milan, Italy

[21] Appl. No.: 287,050

[22] Filed: Dec. 21, 1988

[30] Foreign Application Priority Data

Dec. 23, 1987 [IT] Italy ................. 23181 A/87

[51] Int. Cl.$^5$ .................... H03K 17/284; H03K 17/72
[52] U.S. Cl. ..................................... 307/570; 307/584; 307/631; 307/639; 307/296.5; 307/605
[58] Field of Search ............... 307/570, 571, 573, 631, 307/638, 639, 594, 599, 605, 584, 296.5, 296.8

[56] References Cited

U.S. PATENT DOCUMENTS 4,520,418 5/1985 Susi ....................................... 307/594

Primary Examiner—John Zazworsky
Attorney, Agent, or Firm—Sixbey, Friedman, Leedom & Ferguson

[57] ABSTRACT

The pilot circuit comprises an R-C network consisting of a condenser inserted between a gate terminal of the MOS transistor and ground and a resistance for charging said condenser. In parallel with the resistance there is placed an SCR circuit with associated threshold circuit which permits firing of the SCR circuit when the charge voltage of the condenser reaches a preset threshold.

4 Claims, 2 Drawing Sheets

PILOT CIRCUIT WITH INTEGRATED CIRCUIT WITH PRESET FIRING DELAY FOR MOS POWER TRANSISTORS

DESCRIPTION

The present invention relates to a pilot circuit with integrated circuit with preset firing delay for MOS power transistors.

Various applications of MOS power transistors are known wherein it is required to pilot their firing with a preset firing delay.

One of these applications is represented by a known actuation system for magnetic disc units for computers wherein a first circuit block pilots the electric motor used for rotating the disks and a second circuit block made up of a single integrated circuit pilots the arm bearing the magnetic reading/writing heads as well as some auxiliary functions among which the main one is parking the magnetic heads in case of power failure, thus avoiding disastrous falling of the heads on the discs.

For this last function there is applied the principle of using the motor, still turning by inertia, as a generator to give the aforesaid integrated circuit, by charging a condenser, the necessary energy to park the heads before they fall.

When the parking operation has been completed it is necessary to brake the motor until it stops. This is usually done by an MOS power transistor piloted by the same integrated circuit in such a manner as to fire with a fixed time delay (varying from a fraction of a second to a few seconds) to cause short circuiting of the output voltage of the motor and thus bring about dynamic braking of the motor.

Pilot circuits suitable for controlling firing of an MOS power failure with preset time delay are already known but not entirely satisfactory.

For example there is a known pilot circuit based simply on an R-C network wherein the output voltage of the motor progressively charges the capacitance until the voltage of the latter reaches the conduction threshold of the MOS transistor and causes firing. The firing time delay depends on the sizing of the R-C network.

This known solution presents two serious problems, to wit (1) since the capacitance voltage grows very slowly entry into conduction of the MOS transistor is also very slow, i.e. the transistor does not switch sharply but very slowly and gradually, and (2) given the considerable variety of the threshold voltages of the MOS power transistors there is much uncertainty concerning the trip voltage and hence the firing delay time, which depends on the threshold voltage.

Another known solution employs a comparator which has at its input a reference voltage generator and a condenser chargeable up to the value of said reference voltage to cause tripping of the comparator and consequent firing of the MOS transistor.

In this case the tripping is clean but there are some drawbacks, to wit (1) a voltage reference and at least one current generator are necessary to charge the condenser; (2) a comparator is necessary; (3) if incorporated in an integrated circuit the pilot circuit of the power transistor requires two pins, one for the gate terminal of the MOS transistor and the other for the condenser, which constitutes a limitation on insertion of the pilot circuit of the MOS transistor in an integrated circuit which fulfills various functions like that of the actuation system for magnetic disc units for computers where each pin has its purpose and for the pilot circuit of the MOS transistor only one pin can be reserved; and (4) the structure is not the simplest so that current absorption of the condenser which provides the voltage supply might not be negligible.

In view of this state of the art the object of the present invention is to accomplish a pilot circuit with integrated circuit with preset firing delay for MOS power transistors, specifically but not clearly for use in an actuation system for magnetic disc units for computers which would be free of the aforesaid drawbacks.

More precisely, the object of the present invention is to accomplish a pilot circuit for MOS power transistors which would absorb little current, would provide a firing delay which could be accurately preset and clean conduction of the MOS transistor, would be structurally simple, would occupy little silicon area, and would use a single integrated circuit pin.

In accordance with the invention said object is achieved by a pilot circuit comprising an R-C network consisting of a condenser inserted between a gate terminal of the MOS transistor and ground and a charge resistance of said condenser characterized in that it also comprises an SCR circuit placed in parallel with said resistance and an associated threshold circuit responding to the charge voltage of said condenser in such a manner as to allow firing of said SCR circuit when said charge voltage reaches a preset threshold.

Figure 2:
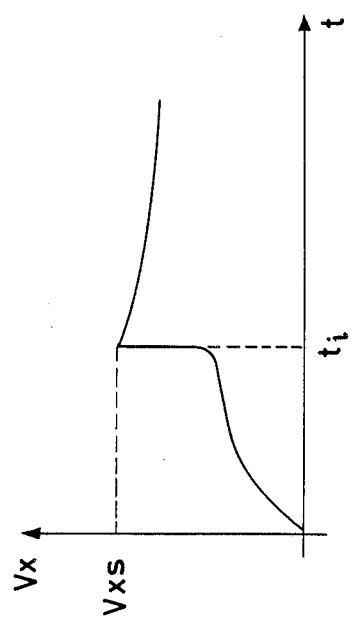
Figure 3:
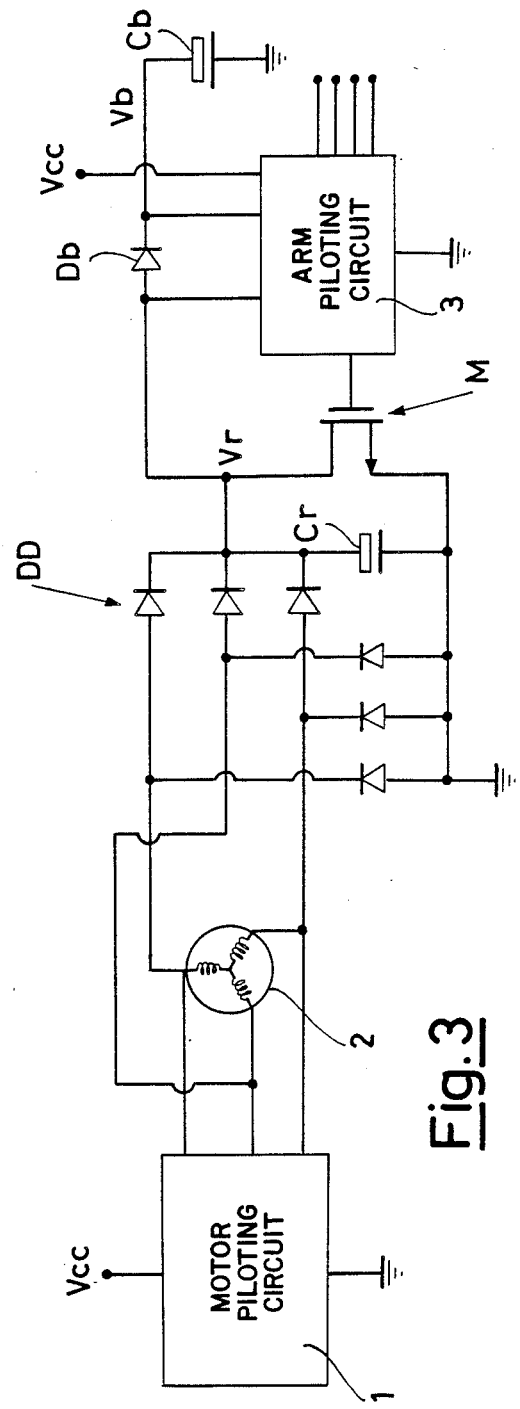

An example of a practical embodiment of the circuit in accordance with the invention is illustrated for greater clarity in the annexed drawings wherein:

FIG. 1 shows a pilot circuit for an MOS power transistor in accordance with the present invention, FIG. 2 shows a diagram illustrating the behaviour of the charge voltage of the condenser included in the circuit of FIG. 1, and FIG. 3 shows an actuating system for magnetic disc units for computers to which may be applied the circuit in accordance with the invention.

In FIG. 1 M indicates an MOS power transistor supplied with voltage Vr. With the gate terminal of the transistor M is associated a pilot circuit with preset firing delay which will be described below.

The pilot circuit comprises an R-C network made up of a condenser Cx and a resistance Rx. The condenser Cx is placed between the gate terminal of the transistor M and ground while the resistance Rx is placed between said gate terminal and a line L which has a voltage Vb taken from Vr through a diode Db and a condenser Cb. The latter have the purpose of maintaining in the pilot circuit a sufficiently stable voltage supply even in case of fast fall of Vr before firing of the transistor M.

The pilot circuit also comprises a fast charge circuit of the condenser Cx which is indicated as a whole by reference CCR and comprises a PNP transistor Q1 with emitter connected to the line L with voltage Vb, collector connected to the gate terminal of the transistor M and base connected to the line L through a resistance R1, a PNP transistor Q2 with emitter connected to the base of the transistor Q1, collector connected to the collector of the transistor Q1 and base connected to the base of the transistor Q1 through a resistance R2 as well as to the collector of said transistor Q2 through two opposed diodes D1 and D2, and lastly an NPN transistor Q3 with collector connected to the base of the transistor Q2 through the diode D1, emitter connected to ground through a resistance R3 and base connected to a gate terminal of the transistor M through a resistance R4.

The transistors Q1, Q2 (in Darlington connection) and Q3 constitute an SCR circuit with which is associated a threshold circuit made up of the transistor Q3 together with the resistances R1, R2 and R3. To the threshold circuit is applied the charge voltage of the condenser Cx.

In operation the voltage Vr charges the condenser Cb at voltage Vb and the condenser Cx begins to charge itself through the resistance Rx. In the cycle starting phase the transistors Q1 and Q2 are turned off and the current in Q3, which also passes through R1, R2 and D1, is given by $$I3 = \frac{Vx - V3}{R3}$$

where Vx is the voltage at the ends of Cx and V3 is the base-emitter voltage of Q3.

When the charge voltage of the condenser Cx reaches a value such as to take Q3 into conduction, the voltage at the ends of R2 rises until it causes Q2 to conduct and with it Q1. Conduction of Q1 causes fast rising of the voltage on Cx and hence on the gate of the transistor M, of which conduction is fired.

Behaviour of the voltage Vx with changing time t is illustrated in the chart in FIG. 2 where it may be seen that an initial slow growth is followed at instant $t_i$ by sudden rising of the voltage to value Vxs, which causes firing of the transistor M, then the subsequent slow fall of said voltage Vx.

The firing delay of the transistor M is given by the formula:

$$\frac{Vs - V3}{R3} = \frac{V2}{R2}$$

where $Vs = Vb(1 - e^{-t/T})$ = firing voltage of the SCR circuit and $T = Rx \cdot Cx$ = time constant of the R-C network Vb is the voltage at the circuit line L, and V2 is the base-emitter voltage of Q2.

Assuming V2 = V3 = Vbe (base-emitter voltage of Q2 equal to that of Q3), we have $$\frac{Vs - Vbe}{R3} = \frac{Vbe}{R2} \quad (1)$$

$$Vs - Vbe = Vbe \frac{R3}{R2}$$

$$Vs = Vbe \left(1 + \frac{R3}{R2}\right)$$

Since, as already mentioned, $Vs = Vb(1 - e^{-t/T})$, we have $$Vs = Vb - Vb \cdot e^{-t/T} \quad (2)$$

$$Vb \, e^{-t/T} = Vb - Vs$$

$$e^{t/T} = \frac{Vb - Vs}{Vb}$$

whence $t = T \ln \frac{Vb}{Vb - Vs}$

Substituting (1) in (2) it appears finally that the firing delay is given by $$t = T \ln \frac{Vb}{Vb - Vbe\left(1 + \frac{R3}{R2}\right)}$$

i.e. it is independent of the threshold voltage of the MOS transistor.

The diodes D1, D2 serve to prevent saturation of the transistor Q2 and hence those current losses to the substrate which occur in an integrated circuit due to the effect of the associated parasite transistor when a PNP transistor is taken to saturation.

This is necessary in order to limit current absorption from the condenser Cb. Said absorption is minimized by the extremely simple structure of the pilot circuit.

The proposed circuit has the following advantageous characteristics. (1) It absorbs little current. (2) It results in a firing delay which can be accurately preset (through Rx, Cx) and clean conduction of the MOS transistor. (3) It uses few components and hence occupies little silicon area. (4) It requires only one pin of the integrated circuit (P in FIG. 1) for the timing and pilot functions of the MOS.

The pilot circuit of FIG. 1 thus lends itself quite well to employment in integrated form in an actuation system for magnetic disc units for computers of the type illustrated in FIG. 3.

Said system includes a first circuit block 1 supplied with voltage Vcc for piloting a 3-phase motor 2 which rotates the magnetic discs. A second circuit block 3 consisting of a single integrated circuit supplied with voltage Vcc is designed for piloting the arm which bears the magnetic reading/writing heads.

The circuit block 3 also performs some auxiliary functions such as the basic one of parking the magnetic heads in case of failure of the supply voltage Vcc.

For this last function the motor 2 operates by generator inertia, charging through a bridge of diodes DD a condenser Cr at a voltage Vr from which the circuit block 3 takes the energy necessary to park the magnetic heads.

An MOS power transistor M is piloted by a pilot circuit like the one shown in FIG. 1 and included in the circuit block 3 in such a manner as to fire after a preset time necessary to permit the magnetic heads to reach parking position.

Firing of the transistor M, whose conduction is then maintained by Db and Cb as already mentioned, causes fall of Vr and consequent braking of the motor 2.

We claim:

1. An integrated pilot circuit with preset firing delay for an MOS power transistor, comprising an R-C network which comprises a condenser inserted between and connected to a gate terminal of the MOS transistor and ground and of a resistance connected in series with said condenser, the pilot circuit further including an SCR circuit provided with threshold circuit means for allowing firing of said SCR circuit when a charge voltage of said condenser reaches a preset threshold.

2. Pilot circuit in accordance with claim 1, wherein said SCR circuit comprises two PNP transistors in Darlington connection placed between a voltage supply and the gate terminal of the MOS transistor and an NPN transistor used for controlling conduction of said two transistors and is in turn controlled by said charge voltage of the condenser.

3. Pilot circuit in accordance with claim 2, wherein said threshold circuit means comprises two resistances in series placed between said voltage supply and said PNP transistors in Darlington connection and a resistance placed on the emitter of said NPN transistor.

4. Pilot circuit in accordance with claim 2, wherein said circuit further comprises diodes to limit current losses of said PNP transistors to the substrate of the integrated circuit.

* * * * *

UNITED STATES PATENT AND TRADEMARK OFFICE
CERTIFICATE OF CORRECTION

PATENT NO. : 4,956,570

DATED : September 11, 1990

INVENTOR(S) : Alberto Gola and Gianluigi Pessina

It is certified that error appears in the above-identified patent and that said Letters Patent is hereby corrected as shown below:

On the title page:
[73] Assignee: SGS-Thomson Microelectronics s.r.L.,
              Agrate Brianza (Milano)

Signed and Sealed this

Thirtieth Day of June, 1992

*Attest:*

DOUGLAS B. COMER

*Attesting Officer*          *Acting Commissioner of Patents and Trademarks*